United States Patent
Aizawa et al.

(10) Patent No.: US 10,777,456 B1
(45) Date of Patent: Sep. 15, 2020

(54) SEMICONDUCTOR BACK END OF LINE (BEOL) INTERCONNECT USING MULTIPLE MATERIALS IN A FULLY SELF-ALIGNED VIA (FSAV) PROCESS

(71) Applicant: Tokyo Electron Limited, Minato-ku, Tokyo (JP)

(72) Inventors: Hirokazu Aizawa, Albany, NY (US); Kaoru Maekawa, Ablany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/356,434

(22) Filed: Mar. 18, 2019

(51) Int. Cl.
  *H01L 21/76* (2006.01)
  *H01L 21/768* (2006.01)
  *H01L 21/321* (2006.01)

(52) U.S. Cl.
  CPC .... *H01L 21/76897* (2013.01); *H01L 21/3212* (2013.01); *H01L 21/7684* (2013.01); *H01L 21/76843* (2013.01); *H01L 21/76877* (2013.01)

(58) Field of Classification Search
  None
  See application file for complete search history.

(56) References Cited

U.S. PATENT DOCUMENTS

| | | | |
|---|---|---|---|
| 6,258,649 B1 * | 7/2001 | Nakamura | H01L 27/10894 438/238 |
| 7,071,099 B1 | 7/2006 | Greco et al. | |
| 7,772,108 B2 * | 8/2010 | Son | H01L 21/76831 257/E21.006 |
| 8,669,181 B1 | 3/2014 | Yu et al. | |
| 9,054,164 B1 * | 6/2015 | Jezewski | H01L 21/76879 |
| 9,502,309 B1 * | 11/2016 | Cheng | H01L 21/823871 |
| 2009/0068836 A1 * | 3/2009 | Kim | H01L 21/76816 438/656 |
| 2010/0252930 A1 | 10/2010 | Liao et al. | |
| 2017/0256449 A1 * | 9/2017 | Zhang | H01L 21/76802 |

* cited by examiner

*Primary Examiner* — Angel Roman
(74) *Attorney, Agent, or Firm* — Wood Herron & Evans LLP

(57) ABSTRACT

Embodiments of systems and methods for semiconductor back end of line (BEOL) interconnect using multiple materials in a fully self-aligned via (FSAV) process. In an embodiment, a method includes receiving a substrate with a patterned structure formed on a surface of the substrate. A method may also include depositing a first interconnect material in a first region of the patterned structure. Such methods may also include depositing a second interconnect material in a second region of the patterned structure, wherein the first interconnect material is different from the second interconnect material, and wherein the first region and the second region include a common layer of the patterned structures.

13 Claims, 8 Drawing Sheets

US 10,777,456 B1

SEMICONDUCTOR BACK END OF LINE (BEOL) INTERCONNECT USING MULTIPLE MATERIALS IN A FULLY SELF-ALIGNED VIA (FSAV) PROCESS

BACKGROUND OF THE INVENTION

Field of Invention

The present invention relates to systems and methods for substrate processing, and more particularly to methods and systems for semiconductor back end of line (BEOL) interconnect using multiple materials in a fully self-aligned via (FSAV) process.

Description of Related Art

As smaller sized features in semiconductor devices are explored, many physical and processing challenges need to be overcome. One such challenge arises with the formation of layer to layer interconnect structures, commonly referred to as vias. As device footprint decreases, the required via width is also shrinking, but not all material are suitable for the narrow width vias. For example, it has be noticed that copper, which has previously been used for device layer interconnects may have too high resistivity. Other materials may be better suited for the narrow interconnects, but not all of the interconnects on a single BEOL layer are always narrow sized interconnects. Some wider interconnects may be two or three times the width, or more. Unfortunately, it has been observed that gaps or other non-uniformities may occur when materials that are suitable for the narrow interconnects are used for formation of the wider interconnects.

SUMMARY OF THE INVENTION

Embodiments of systems and methods for semiconductor BEOL interconnect using multiple materials in an FSAV process. In an embodiment, a method includes receiving a substrate with a patterned structure formed on a surface of the substrate. A method may also include depositing a first interconnect material in a first region of the patterned structure. Such methods may also include depositing a second interconnect material in a second region of the patterned structure, wherein the first interconnect material is different from the second interconnect material, and wherein the first region and the second region include a common layer of the patterned structure.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1:
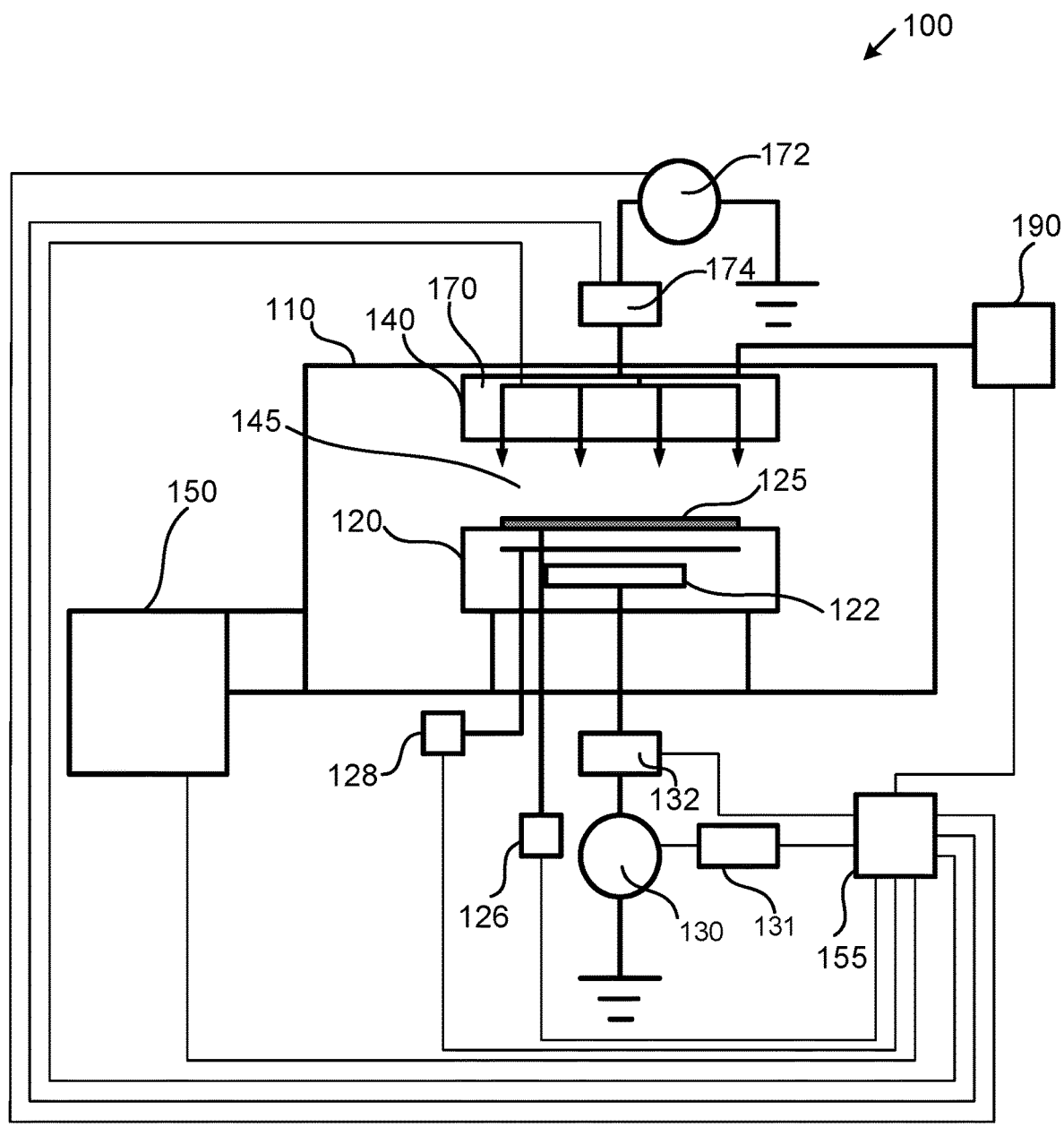
FIG. 1 illustrates one embodiment of a reactive ion etch (RIE) tool for semiconductor processing.

Methods and systems for semiconductor BEOL interconnect using multiple materials in an FSAV process are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

FIG. 1 is an embodiment of a system 100 for semiconductor BEOL interconnect using multiple materials in an FSAV process. In a further embodiment, the system may be configured to perform semiconductor BEOL interconnect using multiple materials in an FSAV process as described with reference to FIGS. 3-6L. An etch and plasma-assisted deposition system 100 configured to perform the above identified process conditions is depicted in FIG. 1 comprising a processing chamber 110, substrate holder 120, upon which a wafer 125 to be processed is affixed, and vacuum pumping system 150. The wafer 125 can be a semiconductor substrate, a wafer, a flat panel display, or a liquid crystal display. Processing chamber 110 can be configured to facilitate etching the processing region 145 in the vicinity of a surface of the wafer 125. An ionizable gas or mixture of process gases is introduced via a gas distribution system 140. For a given flow of process gas, the process pressure is adjusted using the vacuum pumping system 150.

The wafer 125 can be affixed to the substrate holder 120 via a clamping system (not shown), such as a mechanical clamping system or an electrical clamping system (e.g., an electrostatic clamping system). Furthermore, substrate holder 120 can include a heating system (not shown) or a cooling system (not shown) that is configured to adjust and/or control the temperature of substrate holder 120 and the wafer 125. The heating system or cooling system may comprise a re-circulating flow of heat transfer fluid that receives heat from substrate holder 120 and transfers heat to a heat exchanger system (not shown) when cooling, or transfers heat from the heat exchanger system to substrate holder 120 when heating. In other embodiments, heating/cooling elements, such as resistive heating elements, or thermo-electric heaters/coolers can be included in the substrate holder 120, as well as the chamber wall of the processing chamber 110 and any other component within the processing system 100.

Additionally, a heat transfer gas can be delivered to the backside of wafer 125 via a backside gas supply system 126 in order to improve the gas-gap thermal conductance between wafer 125 and substrate holder 120. Such a system can be utilized when temperature control of the wafer 125 is required at elevated or reduced temperatures. For example, the backside gas supply system can comprise a two-zone gas distribution system, wherein the helium gas-gap pressure can be independently varied between the center and the edge of wafer 125.

In the embodiment shown in FIG. 1, substrate holder 120 can comprise an electrode 122 through which RF power is coupled to the processing region 145. For example, substrate holder 120 can be electrically biased at a RF voltage via the transmission of RF power from a RF generator 130 through an optional impedance match network 132 to substrate holder 120. The RF electrical bias can serve to heat electrons to form and maintain plasma. In this configuration, the system 100 can operate as an RIE reactor, wherein the chamber and an upper gas injection electrode serve as ground surfaces.

Furthermore, the electrical bias of electrode 122 at a RF voltage may be pulsed using pulsed bias signal controller 131. The RF power output from the RF generator 130 may be pulsed between an off-state and an on-state, for example. Alternately, RF power is applied to the substrate holder electrode at multiple frequencies. Furthermore, impedance match network 132 can improve the transfer of RF power to plasma in plasma processing chamber 110 by reducing the reflected power. Match network topologies (e.g. L-type, π-type, T-type, etc.) and automatic control methods are well known to those skilled in the art.

Gas distribution system 140 may comprise a showerhead design for introducing a mixture of process gases. Alternatively, gas distribution system 140 may comprise a multi-zone showerhead design for introducing a mixture of process gases, and adjusting the distribution of the mixture of process gases above wafer 125. For example, the multi-zone showerhead design may be configured to adjust the process gas flow or composition to a substantially peripheral region above wafer 125 relative to the amount of process gas flow or composition to a substantially central region above wafer 125. In such an embodiment, gases may be dispensed in a suitable combination to form a highly uniform plasma within the chamber 110.

Vacuum pumping system 150 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 110.

In an embodiment, the source controller 155 can comprise a microprocessor, memory, and a digital I/O port capable of generating control voltages sufficient to communicate and activate inputs to processing system 100 as well as monitor outputs from plasma processing system 100. Moreover, source controller 155 can be coupled to and can exchange information with RF generator 130, pulsed bias signal controller 131, impedance match network 132, the gas distribution system 140, the gas supply 190, vacuum pumping system 150, as well as the substrate heating/cooling system (not shown), the backside gas supply system 126, and/or the electrostatic clamping system 128. For example, a program stored in the memory can be utilized to activate the inputs to the aforementioned components of processing system 100 according to a process recipe in order to perform a plasma assisted process, such as a plasma etch process or a post heating treatment process, on wafer 125.

In addition, the processing system 100 can further comprise an upper electrode 170 to which RF power can be coupled from RF generator 172 through optional impedance match network 174. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, Radial Line Slot Antenna (RLSA™) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz. Moreover, source controller 155 is coupled to RF generator 172 and impedance match network 174 in order to control the application of RF power to upper electrode 170. The design and implementation of an upper electrode is well known to those skilled in the art. The upper electrode 170 and the gas distribution system 140 can be designed within the same chamber assembly, as shown. Alternatively, upper electrode 170 may comprise a multi-zone electrode design for adjusting the RF power distribution coupled to plasma above wafer 125. For example, the upper electrode 170 may be segmented into a center electrode and an edge electrode.

Depending on the applications, additional devices such as sensors or metrology devices can be coupled to the processing chamber 110 and to the source controller 155 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pull-down of structures (pulldown), slimming of structures (slimming), aspect ratio of structures (aspect ratio), line width roughness, substrate throughput, cost of ownership, and the like are achieved.

By modulating the applied power, typically through variation of the pulse frequency and duty ratio, it is possible to obtain markedly different plasma properties from those produced in continuous wave (CW). Consequently, RF power modulation of the electrodes can provide control over time-averaged ion flux and the ion energy.

Figure 2:
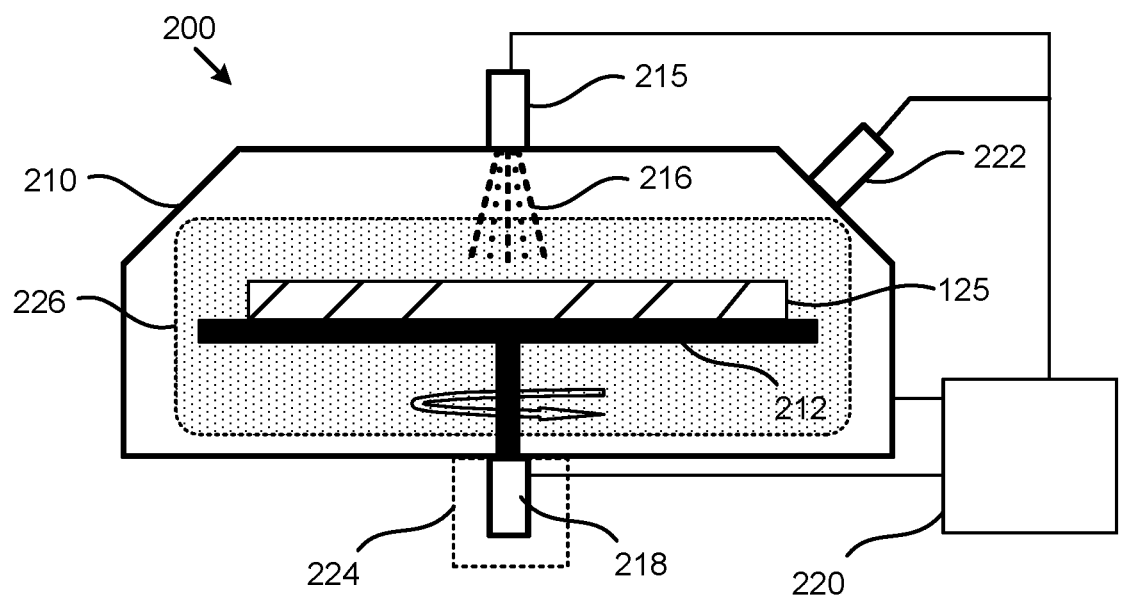
FIG. 2 illustrates one embodiment of a wet etch tool for semiconductor device processing.

Additional embodiments of processing chambers may utilize fluid coatings during device processing, including for example, a wet etch system. An example of a system 200 for wet etch is illustrated in FIG. 2. In such an embodiment, the system 200 includes a wet etch chamber 210 to contain the wet etch chemicals, which may include harsh acids in some embodiments. Examples of wet etch acids may include a weak hydrofluoric acid (HF) dilution (e.g., HF/HCl), or other less aggressive etch recipes known to those of skill in the art.

In an embodiment, the substrate 125 is placed within the chamber 210 on a rotating substrate holder 212, such as a plate or chuck. The rotating substrate holder 212 may be rotated at various rates of rotation by a motorized base 218. In an embodiment, the motorized base 218 may be controlled by a controller 220. Additionally, the etch controller 220 may control a rate at which an etch solution dispenser 215, such as a nozzle or showerhead, may dispense an etch fluid 216, such as the HF dilution. The etch solution may be drawn across a surface of the substrate 125 by centrifugal force, thereby removing particles of material from the substrate surface. The etch rate can be controlled by the etch controller 220, by adjusting the rate of rotation, the rate of dispensing, or both.

Similarly, a gas 226 may be introduced into the wet etch chamber 210 by as gas injection system 222. The gas injection system 222 may be substantially similar to the gas injection system 122 described in FIG. 1, but may be configured to inject gases specific for wet etch chemistries. The gas injection system 222 may be coupled to and controlled by the etch controller 220. In various embodiments, the gas 226 may be selected according to the wet etch chemistry selected, and may facilitate coverage of the surface of the substrate 125 with the wet etch chemicals 216. For example, the gas 226 may be gaseous hydrogen fluoride (HF) in embodiments where the etch fluid is an HF dilution. One of ordinary skill will recognize various other combinations of gas 226 and etch fluids 216 which may be beneficial.

Figure 3:
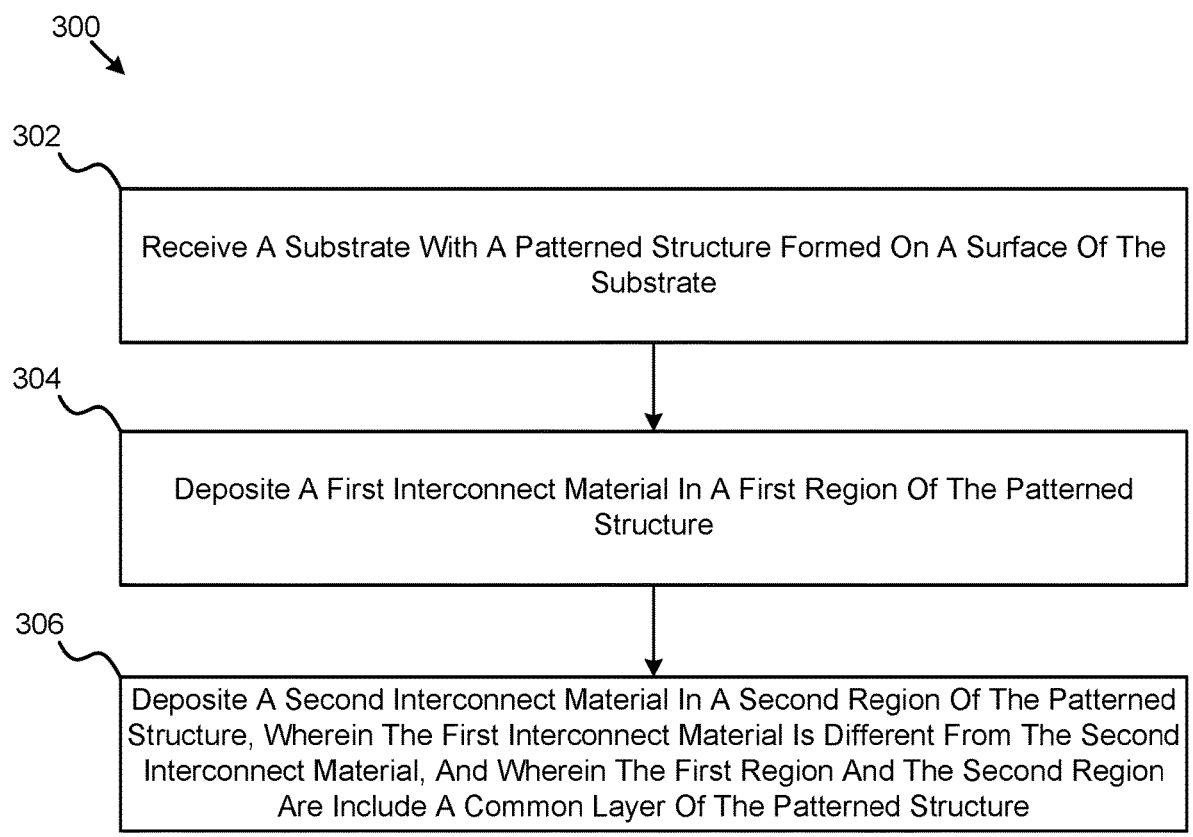
FIG. 3 illustrates one embodiment of a method for semiconductor BEOL interconnect using multiple materials in an FSAV process.

FIG. 3 illustrates an embodiment of a method 300 for semiconductor BEOL interconnect using multiple materials in an FSAV process. In an embodiment, the method 300 includes receiving a substrate with a patterned structure formed on a surface of the substrate, as shown at block 302. The method 300 may also include depositing a first interconnect material in a first region of the patterned structure as shown at block 304. Such methods may also include depositing a second interconnect material in a second region of the patterned structure, wherein the first interconnect material is different from the second interconnect material, and wherein the first region and the second region include a common layer of the patterned structure as shown at block 306.

Figure 4:
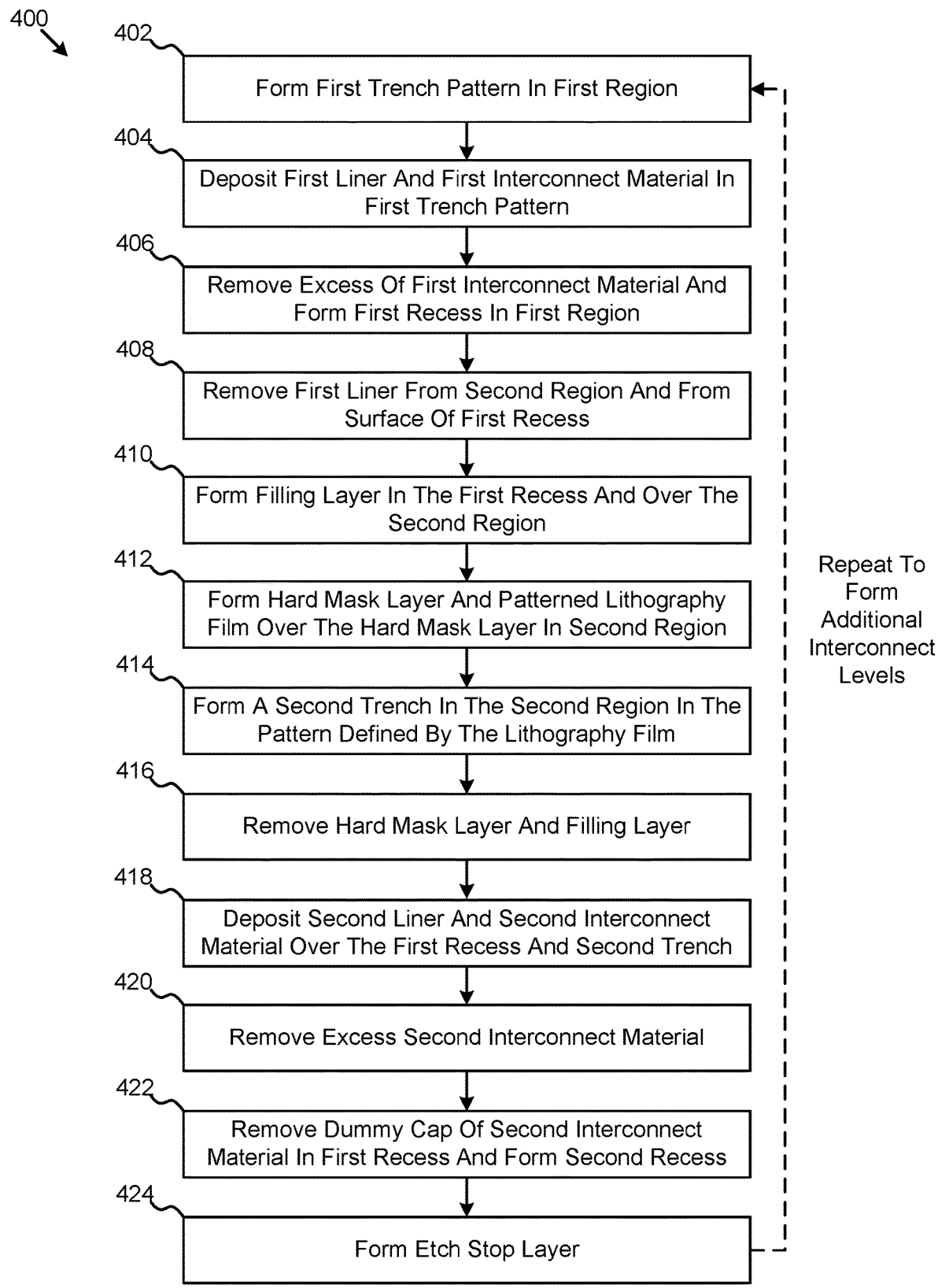
FIG. 4 illustrates one embodiment of a method for semiconductor BEOL interconnect using multiple materials in an FSAV process.

FIG. 4 illustrates a further embodiment of a method 400 for semiconductor BEOL interconnect using multiple materials in an FSAV process. In an embodiment, the method 400 includes forming a first trench pattern in the first region as shown at block 402. In an embodiment, the method 400 further includes forming the first liner comprising the first liner material over at least one layer of the substrate and in the first trench, and forming a layer of the first interconnect material over the first liner as shown at block 404. At block 406, the method 400 includes removing excess of the first interconnect material from the surface of the substrate in the second region and forming a first recess in the first region. At block 408, the method 400 includes removing the first liner material from the second region. The method 400 may also include forming a filling layer in the first recess and over the second region as shown at block 410.

At block 412, the method 400 includes forming at least one hard mask layer over the filling layer, and forming a patterned lithography film over the hard mask layer, the patterned lithography film defining a pattern of a second trench to be formed in the second region. At block 414, the method 400 includes forming the second trench in the second region in the pattern defined by the lithography film. The method 400 may also include removing the hard mask layer, and removing the filling layer as shown at block 416. Also, the method 400 may include depositing the second liner over the first recess and over the second trench, and depositing the second interconnect material in the second trench over the second liner material as shown at block 418.

At block 420, the method 400 includes removing excess of the second interconnect material from the surface of the substrate and forming a chemical mechanical polish (CMP) dummy over the first interconnect material, the CMP dummy comprising the second interconnect material. At block 422, the method 400 includes removing a portion of the second interconnect material from the first region and from the second region to a depth of the CMP dummy.

Additionally, the method 400 may include forming an etch stop layer over the first interconnect material and the second interconnect material, and forming a second level interconnect structure comprising the first interconnect material and the second interconnect material. For example, each of the steps 402-424 may be repeated to form a second level interconnect structure coupled to the first level interconnect structure.

One of ordinary skill will recognize that various steps of the methods described in FIGS. 3-4 may be implemented in the systems of FIGS. 1 and 2. Additional systems, such as chemical mechanical polish (CMP) systems, physical layer deposition (PLD) systems, and the like may be used as well. One of ordinary skill will recognize which steps are to be performed by a specific system. For example, one of ordinary skill will recognize that trenching steps may be performed by the system of FIG. 1 and that certain hard mask removal steps may be performed by the wet etch system of FIG. 2.

Figure 5:
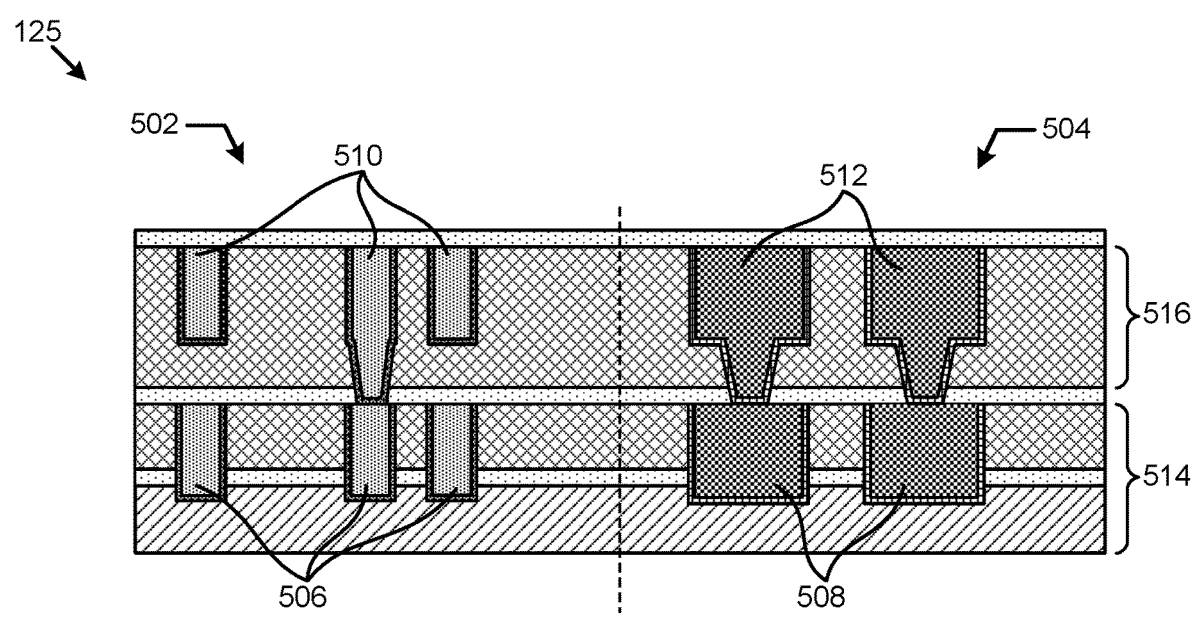
FIG. 5 illustrates an embodiment of a product of the processes of FIG. 3 or FIG. 4.

FIG. 5 illustrates an embodiment of a product that may be produced by the methods of FIGS. 3-4. In an embodiment the product is formed on the substrate 125. The substrate 125 may include a first region 502 and a second region 504. In an embodiment there is not physical boundaries between the first region 502 and the second region 504, except that certain features of a first type or first size are formed in the first region 502 and features of a second type or second size are formed in the second region 504 according to the described methods. In another embodiment, a physical boundary may be formed. The substrate 125 may include multiple layers as described in further detail below with reference to FIGS. 6A-6L. In an embodiment a first set of interconnects 506 may be formed in the first region 502 and a second set of interconnects 508 may be formed in the second region 504. As illustrated, the width of the first set of interconnects 506 may be different from a width of the second set of interconnects 508.

The substrate 125 may further include multiple interconnect levels. For example, the substrate 125 may include a first interconnect level 514 and a second interconnect level 516. In an embodiment, a further set of first interconnects 510 may be formed in the first region of the second level 516 and a further set of second interconnects 512 may be formed in the second region of the second interconnect level 516. As shown, the width of interconnects 510 may be different from the width of interconnects 512.

Figure 6A:
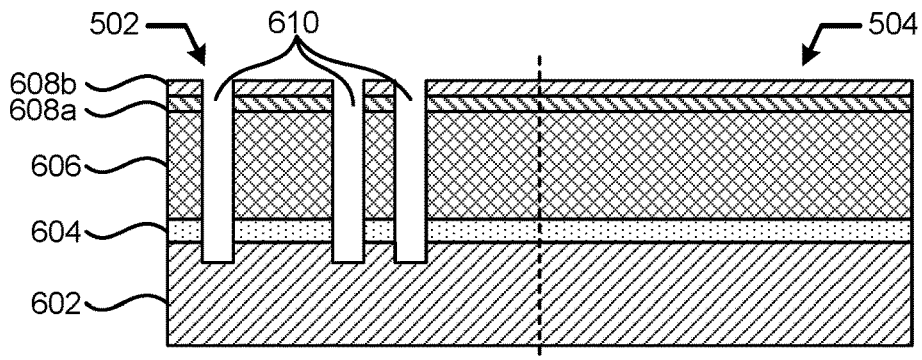
FIG. 6A illustrates one embodiment of a processing step in a processing flow for semiconductor BEOL interconnect using multiple materials in an FSAV process.

FIGS. 6A-6L illustrate a process flow for semiconductor BEOL interconnect using multiple materials in an FSAV process. FIGS. 6A-6L may correspond to embodiments of the steps 402-424 of the method 400 of FIG. 4 respectively. FIG. 6A illustrates forming a first trench pattern 610 in a first region 502 of the substrate 125. In an embodiment, the substrate 125 may include a plurality of layers, including an underlying layer 602, an etch stop layer 604, a low-k layer 606 and one or more hard mask layers 608a, 608b. In an embodiment the first trench pattern 610 may be performed using any one of a conventional single color exposure patterning process, a multiple color exposure patterning process, a self-aligned double patterning (SADP) process, a self-aligned quadruple patterning (SAQP) patterning process, or the like.

Figure 6B:
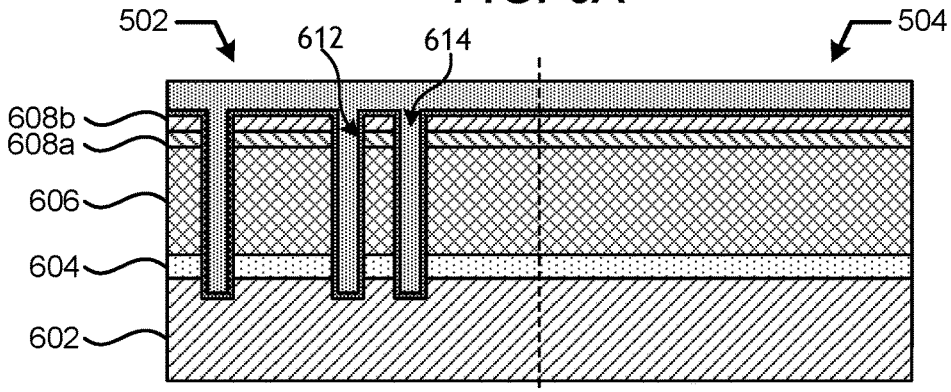
FIG. 6B illustrates one embodiment of a processing step in a processing flow for semiconductor BEOL interconnect using multiple materials in an FSAV process.

FIG. 6B illustrates a result of a process for depositing a first liner 612 and a first interconnect material 614 in a first trench pattern 610. The embodiment of FIG. 6B may include all of the layers described with relation to FIG. 6A, plus the liner layer 612 and the first interconnect material 614. In an embodiment, the liner layer 612 comprises a metal material. Specifically, the liner layer 612 may be selected from materials including tantalum (Ta), tantalum nitride (TaN), titanium (Ti), titanium nitride (TiN), Cobalt (Co) or ruthenium (Ru). In an embodiment, the first interconnect material 614 may include a metal, such as cobalt (Co), tungsten (W), ruthenium (Ru), nickel (Ni), molybdenum (Mo), iridium (Ir), or rhodium (Rh).

Figure 6C:
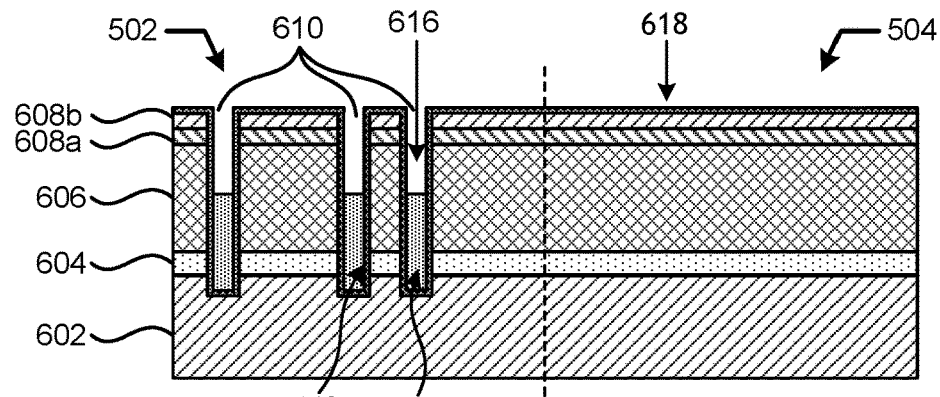
FIG. 6C illustrates one embodiment of a processing step in a processing flow for semiconductor BEOL interconnect using multiple materials in an FSAV process.
Figure 6D:
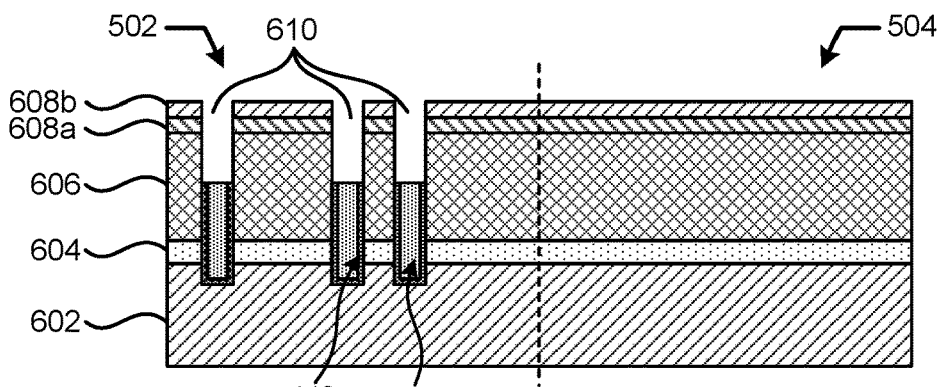
FIG. 6D illustrates one embodiment of a processing step in a processing flow for semiconductor BEOL interconnect using multiple materials in an FSAV process.

FIG. 6C illustrates an embodiment of a result of removing an excess of the first interconnect material 614 and forming a first recess 616 in the first region 502. In an embodiment, the excess of first interconnect material 614 may be removed using either a dry etching process in the processing system of FIG. 1 or a wet etching process in the wet etch system of FIG. 2. Similarly, the recess may be formed by either process according to processing requirements. One of ordinary skill will recognize which process with be preferable for a given application. In an embodiment, the excess of first interconnect material 614 may be removed in the second region 504 down to the hard mask layer 608a, or 608b as illustrated by arrow 618. In a further embodiment, a portion of the first liner 612 may be removed. Specifically, the exposed portions of the first liner 612 in the recess 616 and the exposed first liner 612 in the second region 504 may be removed as illustrated in FIG. 6D.

Figure 6E:
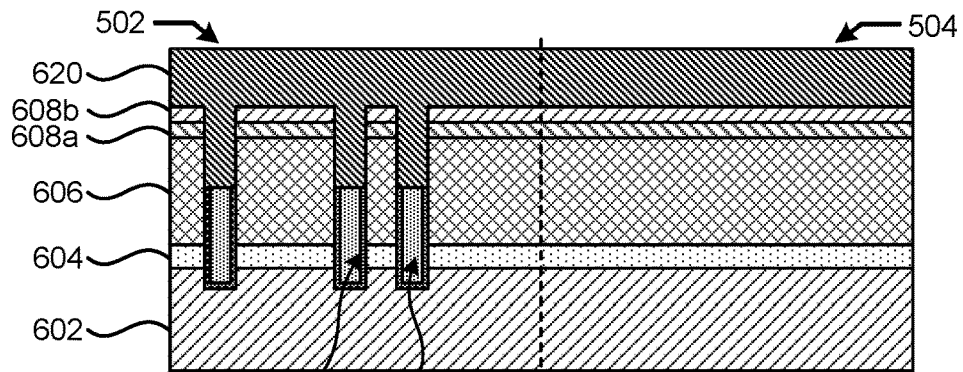
FIG. 6E illustrates one embodiment of a processing step in a processing flow for semiconductor BEOL interconnect using multiple materials in an FSAV process.

FIG. 6E illustrates an embodiment of a result of the step of forming a filling layer 620 in the first recess 618 and over the second region 504. In an embodiment, the filling layer 620 may include a spin on hard mask (SOH) material, an organic dielectric layer (ODL), an organic planarization layer (OPL), or an ash-less carbon (ACL) material. In some embodiments, ACL may be beneficial because the ACL may be removed by a thermal process and doesn't need plasma ashing or RIE which can cause metal oxidation and damage to the low-k layer 606.

Figure 6F:
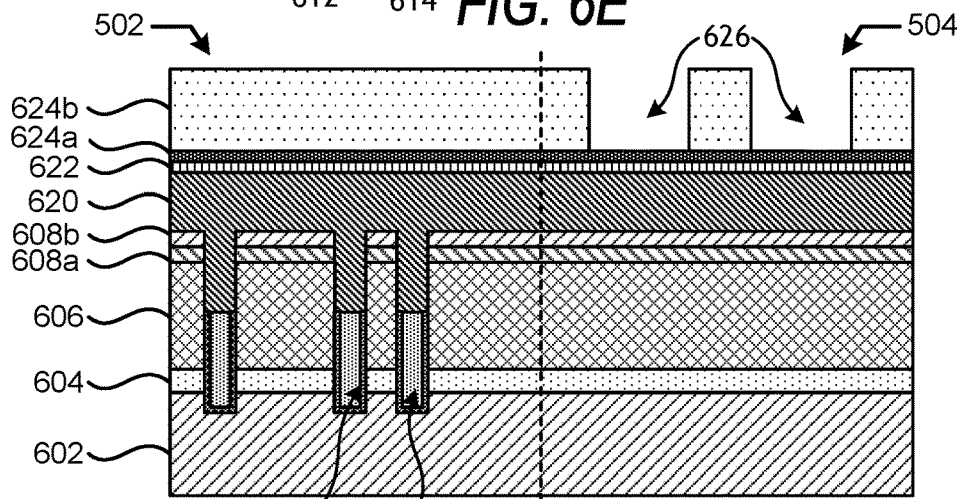
FIG. 6F illustrates one embodiment of a processing step in a processing flow for semiconductor BEOL interconnect using multiple materials in an FSAV process.
Figure 6G:
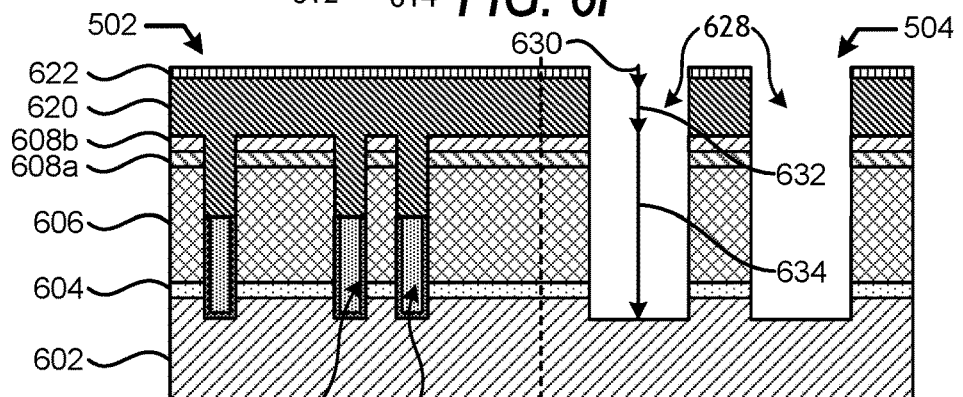
FIG. 6G illustrates one embodiment of a processing step in a processing flow for semiconductor BEOL interconnect using multiple materials in an FSAV process.

In an embodiment, one or more hard mask layers 622 may be formed over the filling layer 620 and one or more lithography films 624a, 624b may be formed over the hard mask layer 622 as illustrated at FIG. 6F. In an embodiment, the lithography film 624b may be patterned with a pattern 626 in the second region 504 according to a pattern that will define the shape and dimensions of the second trench patter 628 as illustrated in FIG. 6G. In an embodiment, the hard mask layer 622 may be formed of a material such as TiN, TaN, W, SiN, SiON, or SiO2. In one embodiment, TiN may be used for the hard mask layer 622 because it is easily removed.

FIG. 6G illustrates the result of a first etch 630 through the hard mask layer 622, a second etch 632 through the filling layer 620 and a third etch 634 through the hard mask layers 608a, 608b and the low-k layer 606 to form the second trench pattern 628 in the second region 504.

Figure 6H:
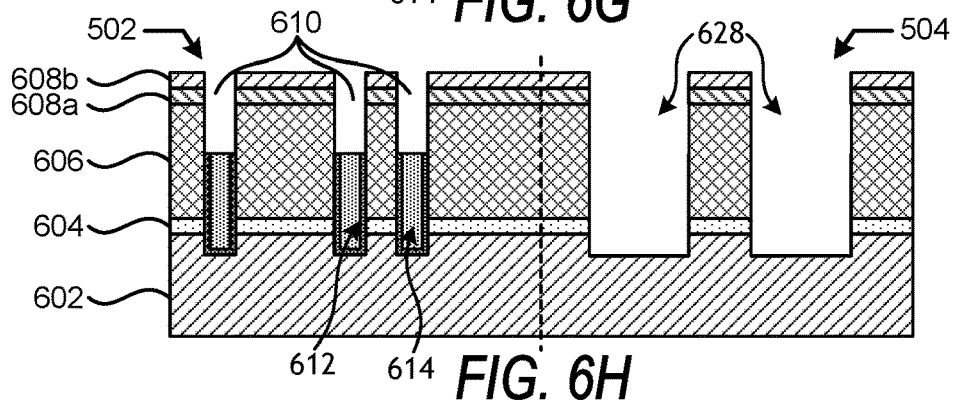
FIG. 6H illustrates one embodiment of a processing step in a processing flow for semiconductor BEOL interconnect using multiple materials in an FSAV process.

FIG. 6H illustrates a result of a processing step of removing the hard mask layer 622 and filling layer 620. In an embodiment, the hard mask layer 622 may be removed using wet etching, such as EKC manufactured by TK10 Dupont, or other TiN wash products. The filling material 620 may be removed using a non-$O_2$ plasma etch or baking process.

Figure 6I:
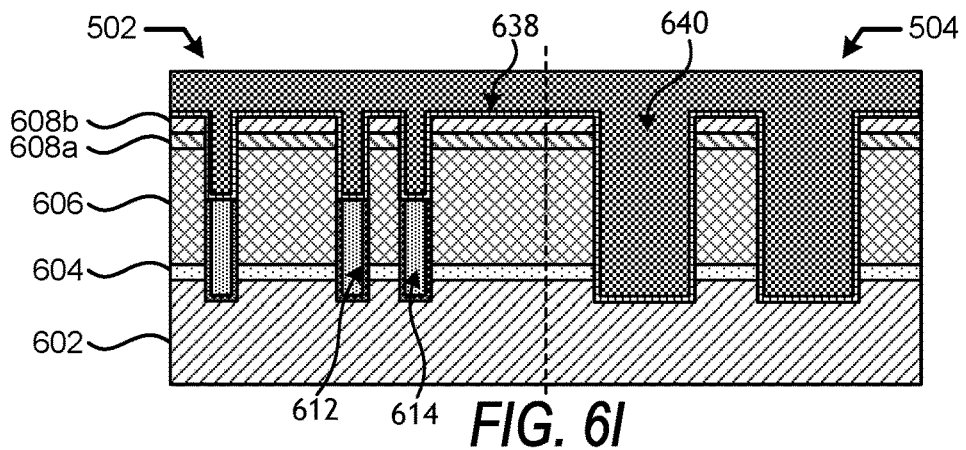
FIG. 6I illustrates one embodiment of a processing step in a processing flow for semiconductor BEOL interconnect using multiple materials in an FSAV process.

FIG. 6I illustrates a result of a processing step of depositing a second liner 638 and a second interconnect material 640. In an embodiment, the second liner material may be Ta, TaN, Ti, TiN, Co, Ru, or any combination of these materials. One of ordinary skill may recognize additional suitable materials that may form the liner material. In an embodiment, the second interconnect material 640 may be a metal. In further embodiments, the second interconnect material may be at least one of copper (Cu), aluminum (Al), silver (Ag) or gold (Au).

Figure 6J:
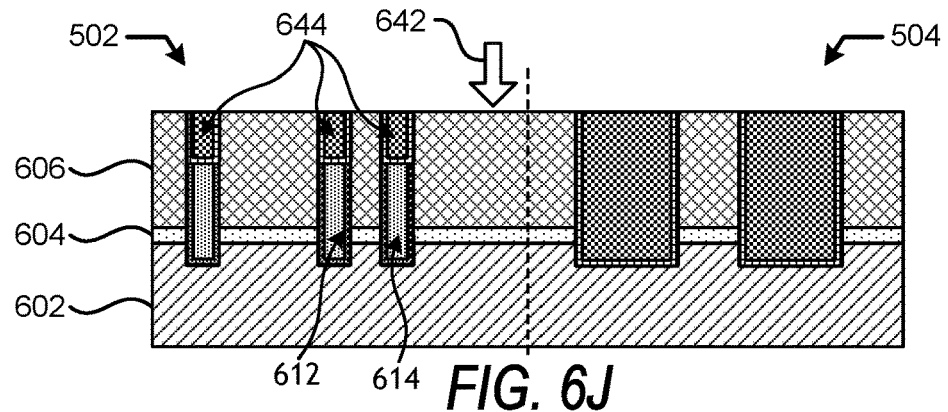
FIG. 6J illustrates one embodiment of a processing step in a processing flow for semiconductor BEOL interconnect using multiple materials in an FSAV process.

FIG. 6J illustrates a result of a process for removing excess of the second interconnect material 640. In an embodiment, the second interconnect material 640 may be removed by a chemical mechanical polish (CMP) process as shown by arrow 642. In a further embodiment, the second interconnect material 640 may be removed until the hard mask layer(s) 608a, b are removed from the surface of the high-k layer 606. In an embodiment such a process may yield one or more CMP dummy features 644 in the first recesses 618 as shown FIG. 6C.

Figure 6K:
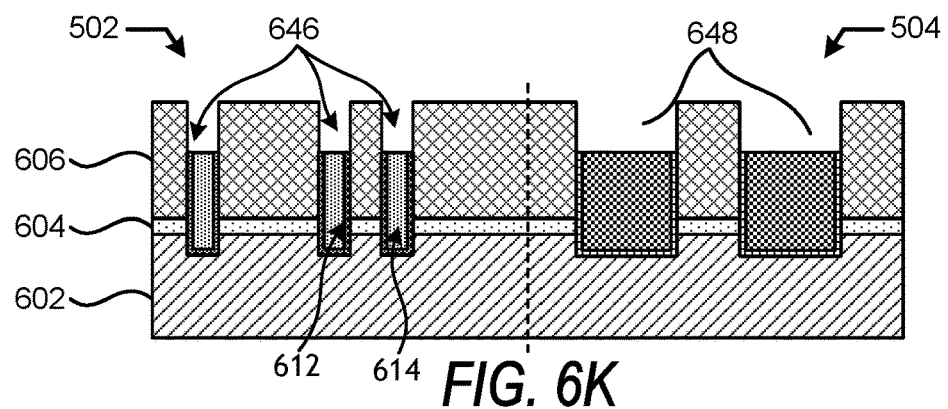
FIG. 6K illustrates one embodiment of a processing step in a processing flow for semiconductor BEOL interconnect using multiple materials in an FSAV process.

FIG. 6K illustrates a result of a process for removing a dummy cap 644 of the second interconnect material in the first recess 646 and forming a second recess 648 in the second region 504. Recess etching may be performed by wet etch processes. In a further embodiment, the second liner 638 may also be removed in exposed regions by a wet etch process.

Figure 6L:
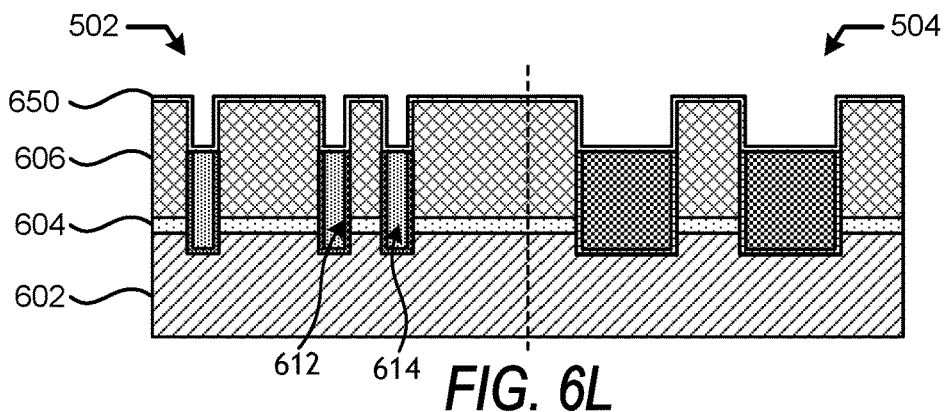
FIG. 6L illustrates one embodiment of a processing step in a processing flow for semiconductor BEOL interconnect using multiple materials in an FSAV process.

FIG. 6L illustrates a result of a process for forming an etch stop layer 650. In such an embodiment, the etch stop layer 650 may comprise silicon carbonitride (SiCN), silicon mononitride (SiN), aluminum nitride (AlN), aluminum monoxide (AlO), silicon carbide (SiC), n-doped silicon carbide also known as NDC, oxygen doped silicon carbide (ODC) material and other similar materials, which is deposited by either chemical vapor deposition (CVD) or atomic layer deposition (ALD) techniques. In an embodiment, the etch stop layer 650 may separate a first interconnect level 514 from a second interconnect level 516. In such an embodiment, additional layers may be formed on the etch stop layer 650 and the described process may be repeated to form interconnect features 510 and 512 on the second interconnect level 516.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

We claim:

1. A method for an interconnect scheme, comprising:
    forming a first trench pattern including a first trench on a surface of a substrate in a first region of the substrate;
    forming a first liner comprising a first liner material over at least one layer of the substrate, which includes a second region, and in the first trench;
    forming a layer of a first interconnect material over the first liner in the first trench and over the second region of the substrate;
    removing excess of the first interconnect material from the substrate in the second region and forming a first recess in the first trench;
    removing the first liner material from the second region;
    forming a filling layer in the first recess and over the second region;
    forming at least one hard mask layer over the filling layer;
    forming a patterned lithography film over the hard mask layer, the patterned lithography film defining a second pattern of a second trench to be formed in the second region;
    forming the second trench pattern including the second trench on the surface of the substrate in the second region of the substrate defined by the lithograph film; and
    depositing a second interconnect material in the second trench, wherein the first interconnect material is different from the second interconnect material, the first trench pattern and second trench pattern define a patterned structure formed in the substrate, and the first region and the second region include a common layer of the patterned structure.

2. The method of claim 1, further comprising forming a second liner in the second region, the second liner being disposed between the second interconnect material and the patterned structure.

3. The method of claim 2, wherein the first liner comprises a first liner material and the second liner comprises a second liner material, wherein the first liner material is different from the second liner material.

4. The method of claim 1, wherein the first interconnect material comprises at least one of ruthenium (Ru), cobalt (Co), tungsten (W), nickel (Ni), molybdenum (Mo), iridium (Ir), or rhodium (Rh).

5. The method of claim 1, wherein the second interconnect material comprises at least one of copper (Cu), aluminum (Al), silver (Ag) or gold (Au).

6. The method of claim 1, wherein the first liner material comprises at least one of tantalum (Ta), tantalum nitride (TaN), titanium (Ti), titanium nitride (TiN), cobalt (Co) or ruthenium (Ru).

7. The method of claim 2, wherein the second liner material comprises at least one of tantalum (Ta), tantalum nitride (TaN), titanium (Ti), titanium nitride (TiN), Cobalt (Co) or ruthenium (Ru).

8. The method of claim 1, wherein the width of the first trench in the first region is different from the width of the second trench in the second region.

9. The method of claim 1, further comprising:
    removing the hard mask layer; and
    removing the filling layer.

10. The method of claim 9, further comprising:
    depositing a second liner over the first recess and over the second trench; and
    depositing the second interconnect material in the second trench over the second liner material.

11. The method of claim 10, further comprising removing excess of the second interconnect material from the surface of the substrate and forming a chemical mechanical polish (CMP) dummy over the first interconnect material, the CMP dummy comprising the second interconnect material.

12. The method of claim 11, further comprising removing a portion of the second interconnect material from the first region and from the second region to a depth of the CMP dummy, the depth of the CMP dummy being approximately the same depth as the first recess in the first region.

13. The method of claim 12, further comprising:
forming an etch stop layer over the first interconnect material and the second interconnect material; and
forming a second level interconnect structure comprising the first interconnect material and the second interconnect material.

\* \* \* \* \*

UNITED STATES PATENT AND TRADEMARK OFFICE
CERTIFICATE OF CORRECTION

PATENT NO. : 10,777,456 B1
APPLICATION NO. : 16/356434
DATED : September 15, 2020
INVENTOR(S) : Hirokazu Aizawa et al.

Page 1 of 1

It is certified that error appears in the above-identified patent and that said Letters Patent is hereby corrected as shown below:

In the Drawings

In FIG. 3, box #306, last line, "Are Include A Common" should be --Include a Common--.

In the Specification

Column 6, Lines 24-25, "Similarly, a gas 226 may be introduced into the wet etch chamber 210 by as gas injection system 222." should be --Similarly, a gas 226 may be introduced into the wet etch chamber 210 by a gas injection system 222.--.

Column 8, Lines 14-15, "self-aligned quadruple patterning (SAQP) patterning process, or the like." should be --self-aligned quadruple patterning (SAQP) process, or the like.--.

Column 8, Lines 36-38, "One of ordinary skill will recognize which process with be preferable for a given" should be --One of ordinary skill will recognize which process will be preferable for a given--.

Column 8, Line 62, "define the shape and dimensions of the second trench patter" should be --define the shape and dimensions of the second trench pattern--.

In the Claims

Column 10, Lines 20-21, Claim 1, "region of the substrate defined by the lithograph film; and" should be --region of the substrate defined by the lithography film; and--.

Signed and Sealed this
Seventeenth Day of November, 2020

Andrei Iancu
*Director of the United States Patent and Trademark Office*